US011370165B2

(12) United States Patent
Holt et al.

(10) Patent No.: US 11,370,165 B2
(45) Date of Patent: Jun. 28, 2022

(54) METHOD FOR IMPROVING RESOLUTION IN LCD SCREEN BASED 3D PRINTERS

(71) Applicant: PhotoCentriC Limited, Peterborough (GB)

(72) Inventors: Paul Holt, Peterborough (GB); Kalvis Gredzens, Peterborough (GB); Richard Wenborn, Peterborough (GB)

(73) Assignee: PhotoCentriC Limited, Peterborough (GB)

( * ) Notice: Subject to any disclaimer, the term of this patent is extended or adjusted under 35 U.S.C. 154(b) by 184 days.

(21) Appl. No.: 16/534,175

(22) Filed: Aug. 7, 2019

(65) Prior Publication Data
US 2020/0047407 A1   Feb. 13, 2020

(30) Foreign Application Priority Data
Aug. 7, 2018 (GB) ..................................... 1812824

(51) Int. Cl.
*G06T 19/00* (2011.01)
*B29C 64/129* (2017.01)
*G03F 7/20* (2006.01)

(52) U.S. Cl.
CPC .......... *B29C 64/129* (2017.08); *G03F 7/2022* (2013.01); *G06T 19/00* (2013.01); *G05B 2219/34103* (2013.01)

(58) Field of Classification Search
CPC ... B29C 64/129; B29C 64/286; B29C 64/264; B29C 64/393; G06T 19/00; G03F 7/2022;
(Continued)

(56) References Cited

U.S. PATENT DOCUMENTS

| 7,790,093 B2 | 9/2010 | Shkolnik et al. |
| 2008/0080614 A1* | 4/2008 | Munoz .................. H04N 7/012 375/240.01 |

(Continued)

FOREIGN PATENT DOCUMENTS

| CN | 106903877 A | 6/2017 |
| EP | 2186625 * | 5/2020 |
| WO | 2017062630 A1 | 4/2017 |

OTHER PUBLICATIONS

TechTerms.Com, definition of LCD screen, 2017. (Year: 2017).*

*Primary Examiner* — Hien D Khuu
(74) *Attorney, Agent, or Firm* — E. Eric Mills; Nexsen Pruet, PLLC

(57) ABSTRACT

A method of controlling the sub-pixels in LCD screens in 3D printers is described for increasing the resolution of a printed 3D object. A stereolithographic 3D printer comprises an LCD screen comprising a plurality of pixels, each pixel comprising a plurality of sub-pixels; a 3D printing apparatus; a memory configured to store data representing a 3D object; and a processor. The resolution of the printed 3D objection is increased by dividing the 3D object represented by the data into a plurality of slices, mapping each slice of the 3D object to a pixel layout of the LCD screen, determining a proportion of each pixel that is contained within each slice of the 3D object, assigning illumination values to the sub-pixels of each pixel based on the determined proportion for the respective pixel for each slice, and controlling both the LCD screen in accordance with the assigned illumination values.

16 Claims, 4 Drawing Sheets

(58) Field of Classification Search
CPC ........ G03F 7/0037; G05B 2219/34103; B33Y 10/00; B33Y 30/00; B33Y 50/00; G09G 3/2074

See application file for complete search history.

(56) References Cited

U.S. PATENT DOCUMENTS

| | | | |
|---|---|---|---|
| 2010/0125356 A1* | 5/2010 | Shkolnik | G06T 5/006 |
| | | | 700/98 |
| 2015/0137426 A1* | 5/2015 | Van Esbroeck | B33Y 10/00 |
| | | | 264/401 |
| 2017/0031207 A1* | 2/2017 | Li | B33Y 10/00 |
| 2017/0102679 A1 | 4/2017 | Greene et al. | |

* cited by examiner

METHOD FOR IMPROVING RESOLUTION IN LCD SCREEN BASED 3D PRINTERS

CROSS-REFERENCE TO RELATED APPLICATIONS

This application claims priority under 35 U.S.C. § 119 to Great Britain Patent Application No. 1812824.9, filed Aug. 7, 2018, the entirety of which is incorporated by reference herein.

FIELD

This invention relates to three-dimensional (3D) printers used to make a 3D object and in particular 3D printers where the method of forming the 3D printed object is by selectively hardening liquid photopolymer by electromagnetic radiation emitted through liquid crystal display (LCD) screens.

BACKGROUND 3D printing, also known as rapid prototyping or additive manufacturing, is a method of forming 3D objects by building up sequential layers, each defined using a respective digital representation. The digital representations may be formed by scanning a physical object in three-dimensions or may be formed by digitally sectioning a three-dimensional computer-aided design (CAD) image. Typically, the layers are slices of equal thicknesses. In stereolithography apparatus (SLA) printing, the printer builds 3D objects from successive layers of selectively polymerised (hardened) liquid photosensitive polymer (resin) also referred to as photopolymer. The liquid photopolymer is polymerised by exposure to electromagnetic radiation of an appropriate wavelength, e.g. visible or near ultraviolet light.

To form a 3D printed object by SLA 3D printing selective illumination with electromagnetic radiation is provided from an imaging source to form each layer, with the first layer being formed on a build platform, before separation between the build platform and imaging source takes place and the build platform separation distance to the screen is increased by the thickness of a layer and the next layer of selective polymerisation is formed attached to the preceding layer. The process of selective exposure and separation is repeated until the complete 3D printed object has been built-up. This can be achieved with the platform lowering down from the screen (top-down) or with it raising up from the screen (bottom-up).

Traditionally photopolymer was selectively hardened by light emitted from a laser or by focusing the light from a digital light processing (DLP) projector emitted through its digital mirror device onto either the upper or lower layer of resin in a vat. This invention, however, relates to the field of 3D printing where the image source is a visual display screen, specifically an LCD screen.

LCD screen based 3D printers have recently become widely manufactured typically incorporating the LCD screen from mobile phones as the digital mask to deliver custom polymerisation. LCD screens are particularly attractive for digital image creation in 3D printers because they are mass manufactured consumer items and are therefore available at very low cost. Furthermore, they generate very high-resolution images driven by the demand for higher and higher quality images for human viewing. They expose an entire layer of the vat simultaneously with relatively even light distribution without any requirement to refocus the light through a lens. They are available in a wide variety of formats from the very small screens used in near-eye headsets, mobiles, tablets, monitors and large format TV screens. Furthermore, the LCD screens, and the printers that contain them, are simpler to manufacture than competitive technologies. In the case of a laser based 3D printer, complex electronics and galvanometers are required and in the case of a DLP printer, a lens is required to refocus the widening light beam back onto a smaller area. In contrast, visual display screen device based 3D printers are effectively composed of an electronic driver board, a linear drive, a resin containment vat, a visual display screen and optionally a modified light generation source.

The image in LCD based 3D printers is created by pixels with the colour of light usually being created by combining the separate light emitted from the screen's sub-pixels, typically, but not exclusively, by simultaneously opening the blue, green and red sub-pixels to create polymerisation. As polymerization in 3D printers is a binary process, in that you can either create light polymerization or not, LCD screen based printers are usually arranged to deliver a monochromatic image, most commonly white or blue light to create polymerization and no light to prevent it.

As most photopolymers used in these types of LCD based printers incorporate photoinitiators that are active in the near-UV region or blue light visible, it is the blue sub-pixel that creates nearly all or all of the polymerization, with the green (if illuminated) providing a smaller usable amount and the red sub-pixel providing almost no useful energy. Thus, the light emitted through the LCD screen that can create polymerization is effectively emitted through only one third of the available area of a pixel. Therefore to achieve polymerization that hardens and joins the resin above two neighbouring pixels the exposure time must be extended to allow the blue light to widen laterally to harden the liquid above the green and red sub-pixels.

There have been numerous different approaches to improving the image in LCD or digital micro-mirror device based 3D printers with the intention of delivering resolutions at greater than pixel size.

U.S. Pat. No. 7,790,093 to Shkolnik et al, herein incorporated by reference in its entirety, describes methods for improving the image in DLP based printers by shifting the array of pixels laterally by a distance of less than a pixel to deliver a resolution of less than a pixel.

US 2017/0102679 to Greene et al, herein incorporated by reference in its entirety, describes methods for improving image in LCD or DLP based printers by delivering a greyscale image to voxels via the sub-pixels.

US 2017/0031207 to Li, herein incorporated by reference in its entirety, describes methods for improving the image in LCD based 3D printers by using monochrome light through the sub-pixels.

CN106903877A, herein incorporated by reference in its entirety, describes methods for delivering a greyscale image via the red, green and blue sub-pixels in LCD screen based 3D printera.

SUMMARY

In an aspect, a stereolithographic 3D printer comprises a liquid crystal display (LCD) screen comprising a plurality of pixels, each pixel comprising a plurality of sub-pixels; a 3D printing apparatus; a memory configured to store data representing a 3D object; and a processor configured to: divide the 3D object represented by the data into a plurality of slices, map each slice of the 3D object to a pixel layout of the LCD screen, determine a proportion of each pixel that is contained within each slice of the 3D object, assign illumination values to the sub-pixels of each pixel based on the determined proportion for the respective pixel for each slice, and control both the LCD screen in accordance with the assigned illumination values, and the 3D printing apparatus to print the 3D object.

In some embodiments, the 3D printing apparatus comprises a liquid photopolymer vat; a build platform having a build surface; and an actuator that varies a separation distance between the build surface and the LCD screen.

In some cases, the LCD screen is monochromatic.

In another aspect, a method of controlling a stereolithographic 3D printer having a liquid crystal display (LCD) screen comprises dividing a 3D object represented by a data file into a plurality of slices; mapping each slice of the 3D object to a pixel layout of the LCD screen, the LCD screen comprising a plurality of pixels, with each pixel comprising a plurality of sub-pixels; determining a proportion of each pixel that is contained within each slice of the 3D object; assigning illumination values to the sub-pixels of each pixel based on the determined proportion for the respective pixel for each slice; and controlling illumination of the LCD screen in accordance with the assigned illumination values.

In some cases, the method further comprises printing the 3D object. In some cases, the method further comprises plotting the 3D object into a 3D space associated with the LCD screen in the 3D printer; and increasing the effective resolution of one or more axis of the 3D space by assigning new data points to separate the pixels into the plurality of sub-pixels.

The method can further comprise assigning white or a hex value that allow the transmission of light to the sub-pixels within the digital 3D object, wherein the white or hex value level is sufficient to cure a photopolymer within a predetermined curing time required by the 3D printer; and assigning black or a dark color hex value to the sub-pixels that are outside the digital 3D object; wherein the black or dark value is unable to cure the photopolymer within the predetermined curing time required by the 3D printer. In some embodiments, the method further comprises merging new data points into the mapped pixel layout by consolidating sub-pixels into groups to form a new pixel containing multiple sub-pixels from different original pixels; and generating one or more graphic files based on the information assigned to each pixel.

The method can in some instances comprise sending the one or more graphic files to the 3D printer; and using the one or more graphic files to print the 3D object.

In some instances, increasing the effective resolution of the 3D space comprises determining a sub-pixel layout within the LCD screen used in 3D printer; determining a factor by which the amount of data points will be increased; and increasing the effective resolution of the 3D space by generating the sub-pixels.

In some cases, assigning the hex values to the sub-pixels comprises determining the proportion of the sub-pixels that are inside the desired 3D object and correspondingly determining the proportion of the sub-pixels that are outside the desired 3D object and assigning a hex value to each sub-pixel based on a degree of containment.

In some embodiments, merging new data points into the mapped pixel layout comprises: a. determining a point of origin from where the process will begin; b. determining the sub-pixel layout within the LCD panel used in the 3D; c. determining a factor by which the amount of data points will be reduced; and d. merging the new data points into the mapped pixel layout used by the LCD screen.

In some cases, the method comprises adjusting the one or more of the sub-pixel hex values based on a reactivity of a photopolymer resin. Furthermore, in some instances, the method comprises adjusting the one or more sub-pixel hex values based on an unevenness of light transmitted through the LCD screen.

In another aspect, a method of three-dimensional (3D) printing comprises creating a computer graphic file of a 3D structure divided into a plurality of two-dimensional slices; mapping each two-dimensional slice onto a two-dimensional grid of pixels associated with an LCD screen of a 3D printer, each pixel comprising three sub-pixels; identifying perimeter pixels corresponding to a perimeter of each two-dimensional slice; assigning a first value to sub-pixels of each perimeter pixel that are within the perimeter and a second value to sub-pixels of each perimeter pixel outside the perimeter; and selectively illuminating sub-pixels having the first value at a higher intensity than sub-pixels having the second value. In some cases the method further comprising printing the 3D object.

In some embodiments, the first value assigned to sub-pixels within the perimeter is a white or a hex value that allow the transmission of light to the sub-pixels within the digital 3D object, wherein the white or hex value level is sufficient to cure a photopolymer within a predetermined curing time required by the 3D printer. In some cases, the second value assigned to sub-pixels outside the perimeter is a black or a dark color hex value to the sub-pixels that are outside the digital 3D object; wherein the black or dark value is unable to cure the photopolymer within the predetermined curing time required by the 3D printer.

In some embodiments, the method further comprises adjusting the first value based on the reactivity of the photopolymer resin. Furthermore, in some cases the method comprises adjusting the first value based on an unevenness of light transmitted from the LCD screen.

DETAILED DESCRIPTION

Figure 1:
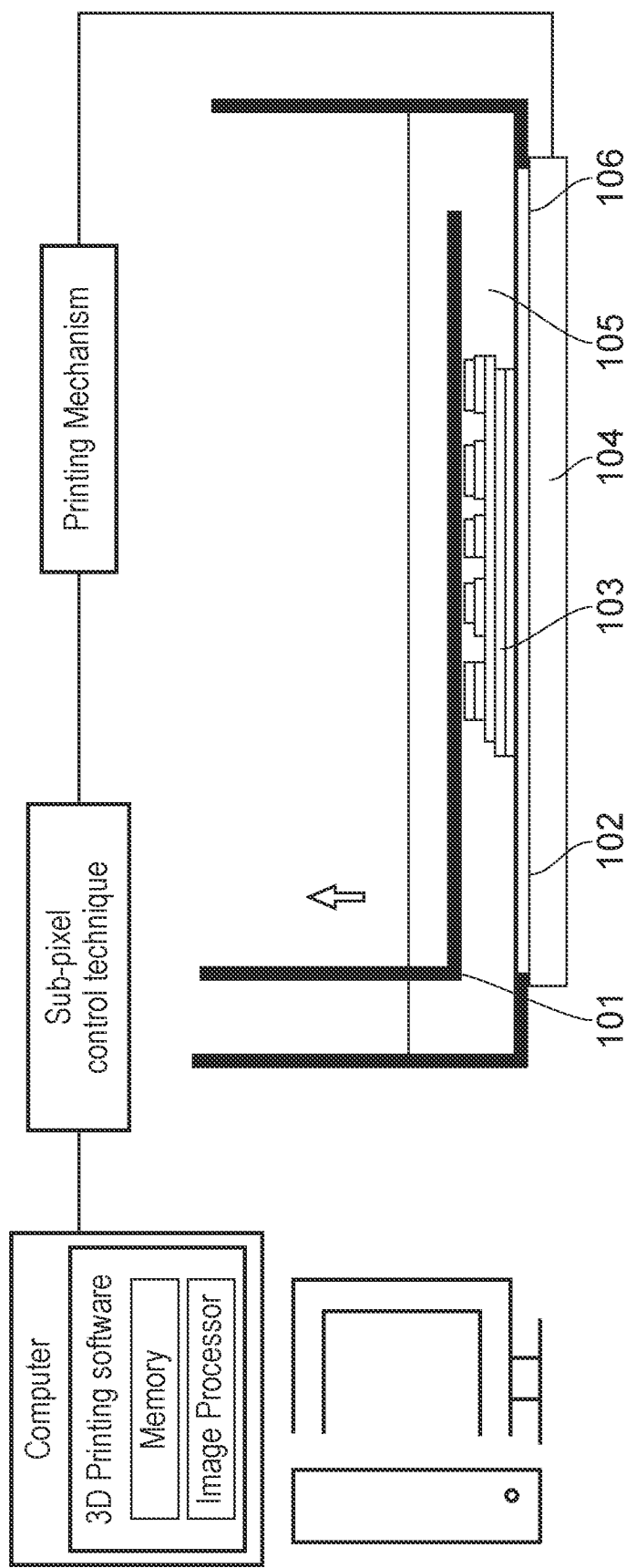
FIG. 1 shows an example of a 3D printing system coupled with a computer.

This invention describes novel methods relating to the separate control of the sub-pixels in an LCD based 3D printer to deliver enhanced resolution by more accurate control of the illumination. More specifically it relates to the independent control of the sub-pixels in monochrome LCD screens. The method of making an object in an LCD based 3D printer includes obtaining an object that describes a 3D structure; creating more than one slice, typically of the same thickness, and creating a file to transfer to the sliced image to the screen. The resolution of the image is defined principally by the accuracy of the representation of the perimeter of each layer, or practically how accurately the pixels or sub-pixels are illuminated to conform to the desired curve of the perimeter with the emitted light being capable of hardening the polymer just above or below it.

It is an object of this invention to assign different intensity levels to the sub-pixels in monochrome LCD screens, utilizing an algorithm to do the calculations that will allow separate control of the three sub-pixels. This will in effect extend the two-dimensional effective resolution in one or more axis by a factor of up to three times.

The mechanism of assigning new values to the pixels around the perimeter of the displayed object involves reassigning hex values which determine how the three sub-pixels allow or prevent the transmission of light. The process of increasing resolution involves determining one or more pixels that are outside the digital representation of the image when translated into the pixel array because the majority of that pixel's area is outside the image (extended pixels) and assigning a high hex value (max: 255) to one of more of the sub-pixels; and determining one or more pixels that are inside the digital representation of the image when translated into the pixel array because the majority of that pixel's area is inside the image (constrained pixels) and assigning a low hex value (min: 0) to sub-pixels which are outside the desired shape of the object.

The implementation of the algorithm can be incorporated into a software system, 3D printing apparatus or associated computer programs. The implementation can include sending the one or more graphic files directly to the LCD screen in the printer or sending one or more graphic files to the 3D printer's computer where the methods claimed can be performed. The implementation involves determining whether the pixels at the perimeter should be extended, ie an additional part of the adjoining pixel is given a high hex value or if the pixels at the perimeter should be constrained, i.e. an existing part of the pixel should be given a low hex value. The implementation involves determining whether the extended pixel should have high or low hex value depending on the desired amount of it is within the contained area.

Mapping the 3D object into the three-dimensional space can include slicing the 3D object into two-dimensional slices and mapping each slice onto a two-dimensional grid of pixels. In this implementation the individual pixels are sliced to form one or more pixels. Determining the one or more containment degrees can include determining a number of data points within a pixel of the one or more pixels that are at least partially contained by the 3D object and determining a number of second points within the pixel that are not contained by the 3D object. Some implementations can include adjusting the one or more low hex value intensity levels based on the rate of cure for given light intensities of the photopolymer. Implementations can include scaling the 3D object based on a scaling factor to account for shrinkage. Implementations can include extending the resolution in one or more axis based on a factor that is dependent on the LCD panel technology. Mapping the 3D object can include slicing the scaled 3D object.

The system can include a computer processor configured to perform operations together with a memory that can store a 3D object that describes a 3D structure. The operations can include mapping the 3D object into a 3D space that conforms to the LCD screen size; calculating and extending the effective resolution of this 2D image in one or more axes by a factor dependent on the number of sub-pixels in the LCD panel used in 3D printer. It can include determining one or more extended pixels that are fully contained within the object and assigning a high hex value (max: 255) to them and assigning a low hex value (min: 0) to constrained pixels which are outside 3D object or aren't fully contained. The low hex value must be sufficient to prevent polymerization and the high hex vale must be large enough to enable polymerisation after a predetermined curing time which is specific to the 3D printer. It can include grouping or merging the extended or constrained pixels into the original resolution starting from any point on one or more of the extended axes. By this process each extended pixel or constrained is the equivalent of one subpixel value in the original resolution.

The 3D printer can include a vat capable of holding photopolymer resin, wherein the vat includes a transparent film; a build plate configured and arranged to move within the vat during three-dimensional printing of a structure on the build plate; a backlight unit to project light through the LCD panel; and an electronic controller to manage the printing process. The controller can be configured to perform operations that include mapping a 3D object into a three-dimensional space; generating one or more graphic files based on assigned intensity levels, utilizing an algorithm to do the essential calculations, extending the effective 2D image resolution in one or more axes by a factor dependent on the number of sub-pixels in the the LCD panel used in 3D printer, determining one or more extended pixels that are fully contained within the object and assigning a high hex value (max: 255) them while assigning a low hex value (min: 0) to constrained pixels which are outside 3D object or aren't fully contained and grouping and merging extended pixels into the original resolution on one or more extended axes.

The 3D printing apparatus may comprise:
a vat for liquid photopolymer;
a build platform having a build surface for use in the vat whilst stereolithographically printing the 3D object; and
an actuator for varying the separation of the build surface and the liquid crystal display screen.

It may further comprise an image processor configured to control the visual display screen to display a sequence of photolithographic images. It may further comprise: an actuation controller configured to control the actuator; wherein the image processor and actuation controller are configured to communicate to synchronise the display of photolithographic images and the varying the separation of the build surface and the visual display screen. It may be that the actuation controller is configured to monotonically increase the separation of the build surface and the visual display screen between successive stereolithographic exposures by a distance corresponding with a layer thickness of a 3D object to be printed. It may be that the actuation controller is configured to increase the separation of the build surface and the visual display screen between successive stereolithographic exposures by a distance greater than a layer thickness of a 3D object to be formed, and subsequently to reduce the separation by a second distance to provide a net increase in separation corresponding with a layer thickness of a 3D object to be formed.

It may be that the liquid crystal display screen forms the base of the vat; and a transparent low surface energy film is provided on the liquid crystal display screen. The film may be a siliconised film. The film may be a perfluoroalkoxy copolymer or a fluorinated ethylene propylene film, optionally wherein the coating is a PFA film. Alternatively, it may be that the liquid crystal display screen is situated outside the vat whilst stereolithographically printing a 3D object, and wherein the vat is transparent to at least part of the spectrum of light that is visible to the human eye or comprises a window that is transparent to at least part of the spectrum of light that is visible to the human eye.

In some embodiments, an advantage of this technology is that it can improve 3D print quality in one or more axes, the following drawings demonstrate the features of this approach.

FIG. 1 shows an example of a 3D printing system connected to a computer which provides information about a 3D structure to the 3D printing system for printing. The computer communicates with a controller of the printing system, the controller having an integrated circuit board with firmware to control the various system components such as the linear drive and backlight unit (104) for the LCD panel (102). The system includes a vat to hold the photopolymer (105) a light transmitting membrane to protect the screen (106) to build the 3D object (103) on the build platform (101). This process shown is known as bottom-up, the reverse procedure known as top-down can also be used. The base of the vat is typically made of a low surface energy high light transmission film, such as fluorinated ethylene propylene (FEP), perfluoroalkoxy copolymer (PFA) or polymethylpentene (PMP), but also can be made of a silicone such as polydimethylsiloxane (PDMS). The light emitted from the backlight will have a wavelength which can initiate the photoinitator incorporated in the photopolymer to create free-radicals or cations from photons and enable polymerisation. The build plate can start at a position near the bottom or top of the vat and selective images of the light are displayed through the LCD panel to create solid layers of the desired structure as the build plate is sequentially moved away from the LCD screen. This system may also include specific adaptions to enable peel and easy removal at the build interface. The light transmitting panel can be configured to allow selective light to pass through the LCD array of pixels, each one comprising of sub-pixels. In some implementations the backlight can unmodified from that supplied with the visual display device, or alternatively it can be a single light emitting diode (LED) positioned a distance away from the LCD panel, or alternatively it can be an array of LEDs with individual lenses or can be a set of lasers with lenses or alternatively any method of illumination that delivers collimated or near-collimated light.

In some implementations, the 3D object can be sliced into grids of pixels with each pixel representing a voxel of the object. A voxel is a three-dimensional pixel. The voxel can be fully contained within the 3D object, partially contained within the 3D object, or entirely outside of the 3D object. Accordingly, each voxel can be assessed to be constrained within or extended outside the desired object. For example, a voxel that is fully constrained can have a containment degree of 100%; a voxel that is outside can have a containment degree of 0%; and a voxel that is partially contained within the 3D object can have a containment degree based on how much of it is included in the 3D object and can be less than 100%, but greater than 0%.

The 3D printing program, the controller, or both can apply sub-pixel color rendering techniques to smooth out the perimeter of each layer of the structure. The sub-pixel color rendering technique can assign light intensity levels based on a sub-pixel containment. The light intensity levels can include a high level for 100% containment (hex value of 255), a black level for 0% containment (hex value of 0), and multiple colors there between 0 and 255 for partial containment within a 3D object. The partial containment values can be computed based on the geometry of the 3D object and the resolution of the screen. Based on the output of the sub-pixel color rendering technique, the 3D printing program, the controller, or both can output the graphic files that represent the desired selective display of light to be passed through the LCD panel to create each layer of the 3D object.

Figure 2:
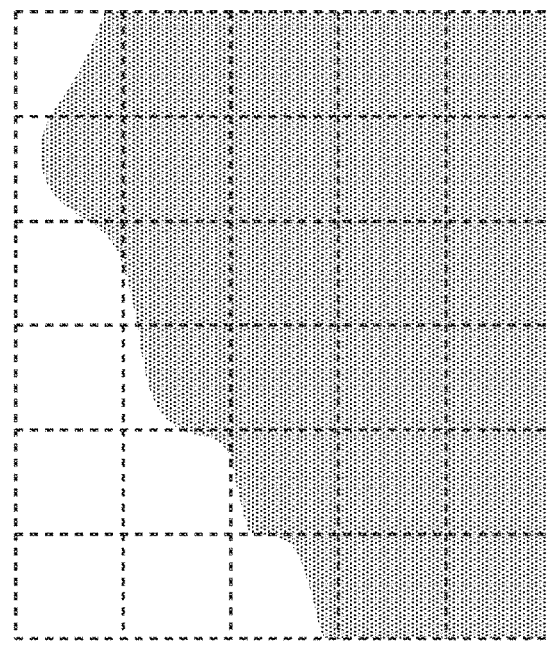
FIG. 2 shows a cross section on an example object before mapping it.

FIG. 2 shows a cross section of an example object before it has been mapped, the digital object has not yet been analyzed and a boundary line which is its perimeter and has not yet been determined. In this example, the boundary line of the digital object goes through a single slice. The boundary line crosses several pixels including sub-pixels and intercepts these pixels at different points. The pixels that are intersected by the boundary line will have a specific hex number attributed to them to deliver sub-pixel control by the algorithm.

Figure 3:
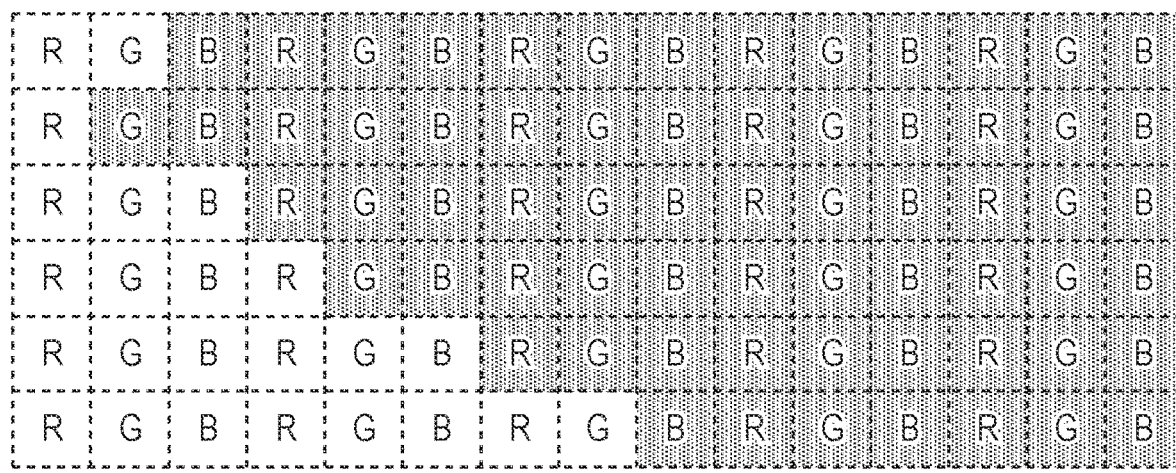
FIG. 3 shows a cross section of an example of a 3D object with additional addressable hex values assigned.

FIG. 3 shows a cross section of an image that has an increased amount of data points. These data points form addressable elements which contain sub-pixel values. The 3D object is plotted onto a grid of pixels, which can increase the data points by multiplying one or more axes of the grid of pixels by a factor. This factor is dependent on the number of sub-pixels in a pixel. In this example, the pixels have been defined as strips of three sub-pixels, called R, G and B. Therefore in this example, the amount of pixels in the revised grid in the x axis will be multiplied by a factor of 3. The grid has the same amount of new addressable elements in one axis as the original resolution has sub-pixels. Therefore, each new addressable element can be assigned with specific hex value to either let the light pass through and polymerise the resin or block the light and leave it liquid, dependent on whether it is fully contained within the digital object or not. Pixels that are not within the object are black and pixels that are fully contained within the object are white.

Figures 4, 5:
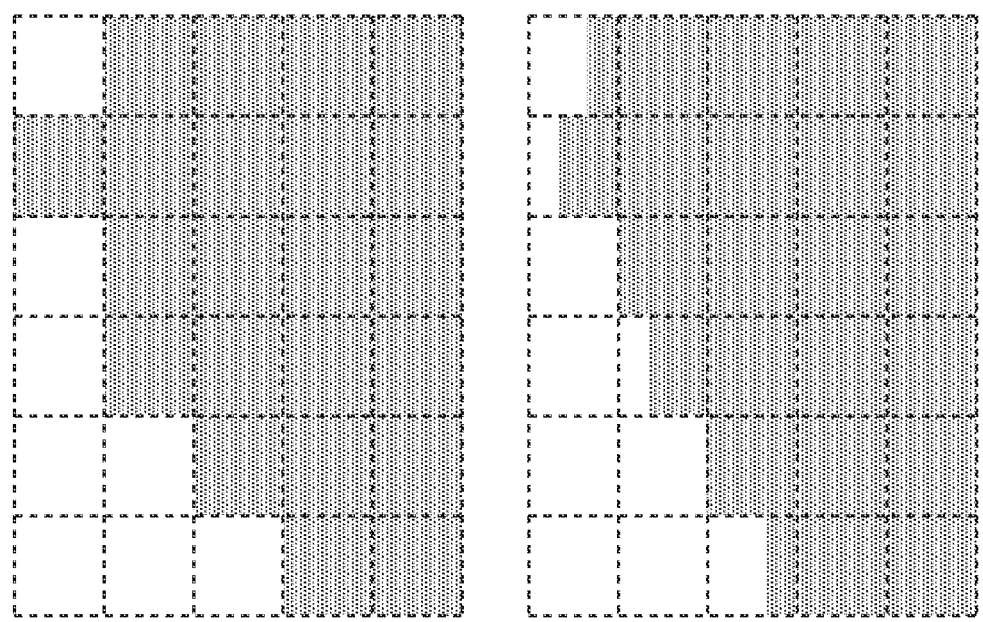
FIG. 4 shows a cross section of an object containing color coding.
FIG. 5 shows a cross section of an example of with and without the sub-pixel rendering process used.

FIG. 4 shows an example of a cross section of a digital object which contains a pixel grid ready to be displayed on the LCD panel. The 3D object is plotted onto an expanded grid of pixels and has all of its addressable elements with assigned values. Starting from any point on one or more extended axis, the resolution is then divided by the same factor by which it was previously expanded. In FIG. 4 the resolution on the x-axis has been merged, generating one pixel containing three sub-pixels, each containing different hex values. This sub-pixel color rendering technique generates 2D graphics files which include a grid of pixels rendered to a specific resolution and pixel pitch to match that of the LCD panel used in the 3D printer. Pixels that are partially contained within a 3D object have different color hex code applied to each individual sub-pixel. One or more sub-pixels within a partially contained pixel which are outside the digital object can have their hex value set to a low number (minimum hex value is 0), therefore blocking the light passing through the LCD panel. One or more sub-pixels, within a partially contained pixel, which are fully contained within a digital object can have their hex value set to high number (maximum hex value is 255).

FIG. 5 shows a cross section of a digital object before and after the sub-pixel color rendering technique has been applied. This method has increased effective resolution in the x-axis threefold thus improving the final object resolution significantly.

Figure 6:
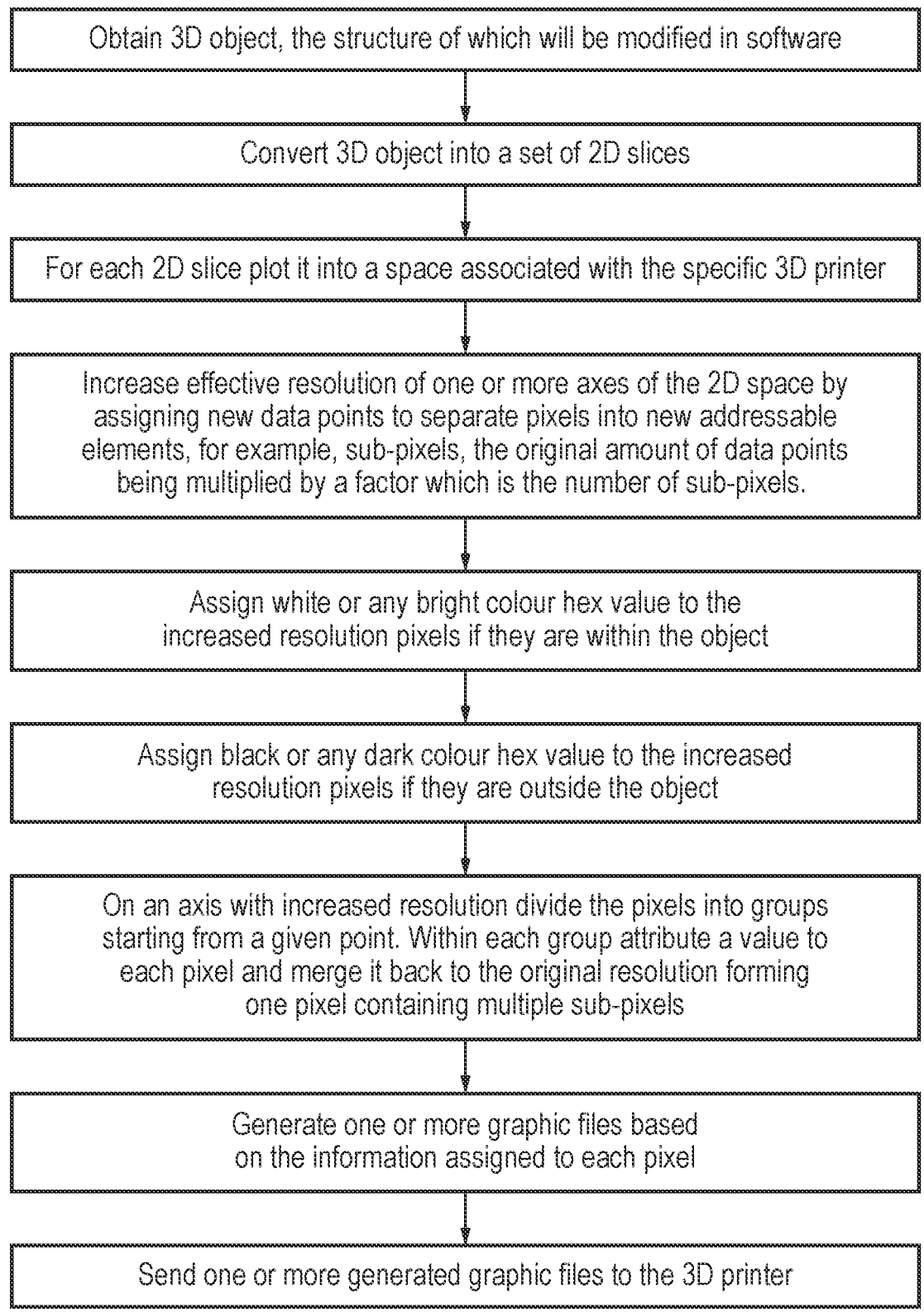
FIG. 6 shows a flowchart of an example of a sub-pixel rendering process that transforms a digital object into graphical data suitable for displaying on a 3D printer.

FIG. 6 shows a flowchart of an example of this sub-pixel rendering technique that can transform a digital object into a graphic data suitable for displaying on a 3D printer and enhance its resolution in the process. A device such as a printer controller or a computer can perform this process. The process obtains a digital object that describes a 3D structure, which can include accessing a file that defines the meshes that cover the surface of the structure. The file can be in a format such as Stereolithography (stl) file format or Polygon File Format (ply), other types of file formats are also possible. The process maps each slice of the 3D object onto an area that is associated with the LCD screen of the 3D printer. Mapping the 3D object can include identifying pixels that are fully contained within the 3D object, pixels that are partially contained within the 3D object and pixels that are outside the 3D object. In some implementations, the process can receive one or more parameters that describe the capabilities of the 3D printer such as the LCD resolution in the x, y and z dimensions and the maximum sizes for each dimension. The process can use these parameters to determine the number and shape of the revised pixels in the grid.

The process will increase the effective resolution of the 2D space in one or more axes. The process generates new data points to separate the sub-pixels into new addressable elements. The 3D object size is then extended by a factor that is the number of sub-pixels in a pixel. The process determines one or more increased resolution pixels that are fully contained within the 3D object and assigns a high hex value (max: 255); determines one or more pixels which are outside 3D object or aren't fully contained and assigns a low hex value (min: 0). The process then divides the pixels into groups starting from any point of origin using the same factor value used to increase the number of addressable elements. In each group the pixels will have their own value assigned. Each group will then be merged back to the original resolution where with each pixel containing multiple sub-pixels. The sub-pixels have their own values assigned and each merged pixel will contain multiple hex values which represent color codes. Typically, LCD panel pixels consist of three sub-pixels, commonly red, green and blue. Monochrome screens can be created by not applying or removing the colour filters, commonly red, green and blue light-transmitting filters. These sub-pixel light intensity levels can be represented as 8-bit values that range from 0 (black) to 255 (white).

The process in this invention generates one or more graphic files based on the new pixel values and assigns new intensity levels to them. In some implementations, the 3D object is sliced into one or more layers in the z-dimension and the process outputs a graphic file such as a Portable Network Graphics (png) file. In some implementations, the process outputs a graphic file containing multiple bitmaps for respective layers and in some implementations the file format can a video file output.

The process in this invention sends one or more graphic files to the 3D printer. In some implementations, sending the one or more graphic files can include transmitting data via a network connection or a Universal Serial Bus (USB). The 3D printer can receive the 3D object, perform the process outlined in FIG. 6 and send the contents of the one or more graphic files to the LCD panel within the 3D printer. Sending the contents can include transmitting a sequence of bits over a serial bus between a controller and the LCD screen or alternatively sending the contents of the one or more graphic files to the 3D printer via a wireless connection or USB interface.

The 3D printer can include a vat capable of holding photopolymer, wherein the vat includes a transparent film base, a build plate configured to move within the vat during printing constructing the solid structure on the build plate, a light source to project light through the LCD panel and a controller to control the printing of the solid structure and to control the light between the light source and the film through individual pixels. The LCD panel can be configured to project the image of each layer for the length of time to enable polymerising of that layer, the light having a predetermined wavelength and an intensity that is sufficient to cure the photopolymer.

The functional operations described in this specification can be implemented in digital electronic circuitry, in computer software, firmware, or hardware. Embodiments of the processes described in this specification can be implemented using computer program instructions encoded on a computer-readable medium for execution by, or to control, the operation of a data processing apparatus, where data processing apparatus includes all devices and machines for processing data, including by way of example a programmable processor, a computer, or multiple processors or computers. The apparatus can include, in addition to hardware, code that constitutes processor firmware, protocol stacks, database management systems, operating systems or a combination of one or more of them. The computer-readable medium can be a hard drive in a computer system or an optical disc or an embedded system. The computer program (also referred to as a program, software, software application, script or code) can be written in any form of programming language, including compiled, interpreted or procedural languages and can be deployed in any form, including as a stand-alone program or as a module, component, subroutine or other unit suitable for use in a computing environment. The processes and logic flows described in this specification can be performed under the control of one or more programmable processors executing one or more computer programs to perform functions by operating on input data and generating output. The processes and logic flows can also be performed by special purpose logic circuitry such as an FPGA (field programmable gate array) or an ASIC (application-specific integrated circuit). Generally, a processor will receive instructions and data from a read-only memory (ROM) or a random-access memory (RAM) or both. The essential elements of a computer are a processor that performs instructions and one or more memory devices for storing the instructions and data. Generally, a computer will also include, or be operatively coupled to receive data from or transfer data to one or more mass storage devices for storing data. Devices suitable for storing computer program instructions and data include all forms of memory, media and memory devices, including by way of example semiconductor memory devices, such as EPROM, flash memory devices, magnetic disks and CD-ROMs. To provide for interaction with the user embodiments of the subject matter described in this specification can be implemented on a computer having a display device such as a visual display monitor. While operations are depicted in the drawings in a particular order, this should not be understood as requiring that such operations to be performed in the particular order shown or that all illustrated operations have to be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Further embodiments of the invention are also described in the following numbered paragraphs:
 1. A method of 3D printing wherein the sub-pixels on a monochrome screen are separately addressed and given new values according to whether their position is inside or outside the perimeter of the desired 3D object.

2. A 3D printer comprising a vat capable of holding a liquid comprising a photopolymer, wherein the vat includes a transparent film, a build plate configured and arranged to move within the vat during three-dimensional printing of a structure on the build plate, a backlight device to project light through a monochrome LCD panel and a controller to control the printing of the structure, movement of the build plate and timing of the light projection device, wherein the controller is configured to perform operations comprising: mapping a 3D object into a three-dimensional space; increasing the effective resolution of one or more axes of the three-dimensional space by assigning new data points to separate pixels into more addressable elements, specifically sub-pixels.

3. A method of paragraph 1 comprising obtaining by a data processing apparatus a 3D object that describes a three-dimensional structure;
plotting by data processing apparatus that 3D object into a three-dimensional space associated with the LCD screen in the 3D printer;
increasing by the data processing apparatus, the effective resolution of one or more axis of the three-dimensional space by assigning new data points to separate pixels into more addressable elements, specifically sub-pixels;
assigning, by the data processing apparatus, white, or any hex value that allow the transmission of light, to the increased resolution addressable elements or sub-pixels, if they are within the digital 3D object, wherein this light colour hex value level is sufficient to cure photopolymer within a predetermined curing time required by the 3D printer; assigning, by the data processing apparatus, black or any dark color hex value to the increased resolution addressable elements or sub-pixels, if they are outside the digital 3D object; wherein this dark value does not enable the photopolymer to cure within a predetermined curing time required by the 3D printer;
merging, by the data processing apparatus, new addressable elements into groups, starting from any origin thus forming one pixel containing multiple sub-pixels from each group of addressable elements;
and generating, by a data processing apparatus, one or more graphic files based on the information assigned to each pixel.

4. A printer of paragraph 2, wherein the 3D printer contains an LCD screen.

5. A printer of paragraph 4, wherein the LCD screen is monochromatic.

6. A method of paragraph 3, comprising sending the one or more graphic files to the 3D printer; and using the one or more graphic files to print the 3D object.

7. A method of paragraph 3, wherein increasing the effective resolution of the three-dimensional space comprises:
determining a sub-pixel layout within the LCD screen used in 3D printer;
determining a factor, by which the amount of data points will be increased; and
increasing the effective resolution of the 3D space by generating new addressable elements.

8. A method of paragraph 3, wherein assigning hex values to the addressable elements comprises:
determining the proportion of the addressable elements that are inside the desired 3D object and correspondingly determining the proportion of the addressable elements that are outside the desired 3D object and assigning a hex value to the addressable elements based on their degree of containment.

9. A method of paragraph 3, wherein merging new data points into the original resolution comprises:
determining a point of origin from where the process will begin;
determining the sub-pixel layout within the LCD panel used in the 3D;
determining a factor, by which the amount of data points will be reduced and
merging the new addressable elements into the original resolution used by the LCD panel in the 3D printer.

10. A method of paragraph 3, comprising adjusting the one or more of the sub-pixel hex values on the basis of the reactivity of the photopolymer resin.

11. A method of paragraph 3, comprising adjusting the one or more sub-pixel hex values based on the unevenness of the light transmitted through the LCD panel in the 3D printer.

The invention claimed is:

1. A stereolithographic 3D printer comprising:
a liquid crystal display (LCD) screen comprising a plurality of pixels, each pixel comprising a plurality of sub-pixels;
a 3D printing apparatus;
a memory configured to store data representing a 3D object; and
a processor configured to:
plot the 3D object into a 3D space associated with the LCD screen in the 3D printer
divide the 3D object represented by the data into a plurality of slices,
map each slice of the 3D object to a pixel layout of the LCD screen,
determine a proportion of each pixel that is contained within each slice of the 3D object,
increase an effective resolution of one or more axis of the 3D space by assigning new data points to separate the pixels into the plurality of sub-pixels;
assign at least one of a white and/or a hex value that allows the transmission of light to the sub-pixels within the digital 3D object, wherein the white and/or hex value level is sufficient to cure a photopolymer within a predetermined curing time,
assign at least one of a black and/or dark color hex value to the sub-pixels that are outside of the digital 3D object, wherein the black and/or dark color hex value is not able to cure the photopolymer within the predetermined curing time; and
control both the LCD screen in accordance with the assigned values, and the 3D printing apparatus to print the 3D object.

2. The stereolithographic 3D printer of claim 1, wherein the 3D printing apparatus comprises:
a liquid photopolymer vat;
a build platform having a build surface; and
an actuator that varies a separation distance between the build surface and the LCD screen.

3. The stereolithographic 3D printer of claim 1, wherein the LCD screen is monochromatic.

4. A method of controlling a stereolithographic 3D printer having a liquid crystal display (LCD) screen, the method comprising:
plotting a 3D object into a 3D space associated with the LCD screen;

dividing the 3D object represented by a data file into a plurality of slices;

mapping each slice of the 3D object to a pixel layout of the LCD screen, the LCD screen comprising a plurality of pixels, with each pixel comprising a plurality of sub-pixels;

determining a proportion of each pixel that is contained within each slice of the 3D object;

increasing an effective resolution of one or more axis of the 3D space by assigning new data points to separate the pixels into the plurality of sub-pixels;

assigning at least one of a white and/or a hex value that allows the transmission of light to the sub-pixels within the digital 3D object, wherein the white and/or hex value level is sufficient to cure a photopolymer within a predetermined curing time;

assigning at least one of a black and/or a dark color hex value to the sub-pixels that are outside the digital 3D object; wherein the black or dark value is unable to cure the photopolymer within the predetermined curing time; and controlling illumination of the LCD screen in accordance with the assigned values.

5. The method of claim 4, further comprising printing the 3D object.

6. The method of claim 4, further comprising:

merging new data points into the mapped pixel layout by consolidating sub-pixels into groups to form a new pixel containing multiple sub-pixels from different original pixels; and generating one or more graphic files based on the information assigned to each pixel.

7. The method of claim 6, further comprising sending the one or more graphic files to the 3D printer; and using the one or more graphic files to print the 3D object.

8. The method of claim 6, wherein increasing the effective resolution of the 3D space comprises:

determining a sub-pixel layout within the LCD screen used in 3D printer;

determining a factor by which the amount of data points will be increased; and increasing the effective resolution of the 3D space by generating the sub-pixels.

9. The method of claim 6, wherein assigning the hex values to the sub-pixels comprises:

determining the proportion of the sub-pixels that are inside the desired 3D object and correspondingly determining the proportion of the sub-pixels that are outside the desired 3D object and assigning a hex value to each sub-pixel based on a degree of containment.

10. The method of claim 6, wherein merging new data points into the mapped pixel layout comprises:

a. determining a point of origin from where the process will begin;

b. determining the sub-pixel layout within the LCD panel used in the 3D;

c. determining a factor by which the amount of data points will be reduced; and d. merging the new data points into the mapped pixel layout used by the LCD screen.

11. The method of claim 6, comprising adjusting the one or more of the sub-pixel hex values based on a reactivity of a photopolymer resin.

12. The method of claim 6, comprising adjusting the one or more sub-pixel hex values based on an unevenness of light transmitted through the LCD screen.

13. A method of three-dimensional (3D) printing comprising:

creating a computer graphic file of a 3D structure divided into a plurality of two-dimensional slices;

plotting the 3D object into a 3D space associated with an LCD screen in a 3D printer;

mapping each two-dimensional slice onto a two-dimensional grid of pixels associated with the LCD screen of the 3D printer, each pixel comprising three sub-pixels;

identifying perimeter pixels corresponding to a perimeter of each two-dimensional slice;

increasing an effective resolution of one or more axis of the 3D space by assigning new data points to separate the pixels into the plurality of sub-pixels;

assigning for each perimeter pixel, a first value to sub-pixels within the perimeter and a second value to sub-pixels outside the perimeter; and selectively illuminating sub-pixels having the first value at a higher intensity than sub-pixels having the second value;

wherein the first value assigned to sub-pixels within the perimeter is at least one of a white and/or a hex value that allows the transmission of light to the sub-pixels within the digital 3D object, wherein the white and/or hex value level is sufficient to cure a photopolymer within a predetermined curing time and;

wherein the second value assigned to sub-pixels outside the perimeter is at least one of a black and/or a dark color hex value to the sub-pixels that are outside the digital 3D object, wherein the black and/or dark value is unable to cure the photopolymer within the predetermined curing time.

14. The method of claim 13, further comprising printing the 3D object.

15. The method of claim 13, further comprising adjusting the first value based on the reactivity of the photopolymer resin.

16. The method of claim 13, further comprising adjusting the first value based on an unevenness of light transmitted from the LCD screen.

* * * * *